US006989581B2

(12) United States Patent
Phillips

(10) Patent No.: US 6,989,581 B2
(45) Date of Patent: Jan. 24, 2006

(54) WIDE BAND GAP BIPOLAR TRANSISTOR WITH REDUCED THERMAL RUNAWAY

(75) Inventor: Timothy Jonathan Phillips, Malvern (GB)

(73) Assignee: Qinetiq Limited, (GB)

(*) Notice: Subject to any disclaimer, the term of this patent is extended or adjusted under 35 U.S.C. 154(b) by 0 days.

(21) Appl. No.: 10/497,814

(22) PCT Filed: Dec. 23, 2002

(86) PCT No.: PCT/GB02/05904

§ 371 (c)(1),
(2), (4) Date: Jun. 4, 2004

(87) PCT Pub. No.: WO03/056629

PCT Pub. Date: Jul. 10, 2003

(65) Prior Publication Data

US 2005/0017266 A1  Jan. 27, 2005

(30) Foreign Application Priority Data

Jan. 3, 2002 (GB) ................................ 0200067

(51) Int. Cl.
*H01L 27/082* (2006.01)
(52) U.S. Cl. ........................ 257/592; 257/565
(58) Field of Classification Search ............ 257/590, 257/591, 592, 593
See application file for complete search history.

(56) References Cited

U.S. PATENT DOCUMENTS 3,868,720 A * 2/1975 New et al.
4,617,724 A * 10/1986 Yokoyama et al.
5,494,836 A 2/1996 Imai 6,365,477 B1 4/2002 Gassler et al.

FOREIGN PATENT DOCUMENTS

| EP | 0 384 113 | 8/1990 |
| JP | 05-114602 | 5/1993 |
| JP | 11-312685 | 11/1999 |

OTHER PUBLICATIONS

Streetman, "Solid State Electronic Devices," 1990, Prentice Hall, third edition, p. 272-274.*
Bayraktaroglu, et al. "Very High-Power-Density CW Operation of GaAs/AlGaAs Microwave Heterojunction Bipolar Transistors", *IEEE Electron Device Letters*, pp. 493-495 (1993).
Liou, et al., "Thermal Stability Analysis of Multiple Emitter Finger Microwave AlGaAs/GaAs Heterojunction Biopolar Transistors", *IEEE MIT-3 Digest*, pp. 281-284 (1993).

* cited by examiner

*Primary Examiner*—Nathan J. Flynn
*Assistant Examiner*—Kevin Quinto
(74) *Attorney, Agent, or Firm*—McDonnell Boehnen Hulbert & Berghoff LLP

(57) ABSTRACT

A bipolar transistor with vertical geometry comprises a base region (1) provided with a base contact (21), emitter and collector regions (2,3) arranged to extract minority carriers from the base region, and an excluding structure for counteracting entry of minority carriers into the base region via the base contact, wherein the base region has a bandgap of greater than 0.5 eV and a doping level greater than $10^{17}$ cm$^{-3}$. As shown the base includes an excluding heterojunction (4) preventing entry of carriers from the base contact (21), but alternatively the base region could comprise a "high-low" doping homojunction. The construction shows improved resistance to thermal runaway even in multi-finger transistors. It is particularly useful for high power, high frequency transistors, e.g. base on gallium indium arsenide. The collector region preferably has a heterostructure.

17 Claims, 2 Drawing Sheets

WIDE BAND GAP BIPOLAR TRANSISTOR WITH REDUCED THERMAL RUNAWAY

The present invention relates to bipolar transistors of the kind which implement exclusion and extraction of minority carriers from the base, and in particular to transistors in which the base region has a wide bandgap, i.e. a wide energy gap between the valence band and conduction band.

The difference in bandgap between the emitter and base regions of a bipolar transistor has a critical effect on current gain, and in determining $f_T$ ($f_T$ is the highest frequency at which $h_{fe}$ is above one). A main method of tailoring a band gap difference is to vary the semiconductor composition on one or both sides of a heterojunction.

Gallium indium arsenide (GaInAs) materials are particularly useful in that they have been demonstrated to provide the highest $f_T$ of any bipolar transistor. This type of device has been disclosed for example in EP 0 977 250 (Daimler Chrysler AG). However, while developments in such devices have concentrated on improving performance, e.g. $f_T$ and $h_{fe}$, they have largely failed to deal with the practical limitations of high frequency use. High frequency operation, as required in microwave and radio communications, results in high levels of heat generation and in practice thermal runaway effects can be the limiting factor in operation.

As is well known, thermal runaway can occur in bipolar devices when an emitter contact is forward biased. For instance, under constant base-emitter voltage conditions when the current through the device rises, the temperature also rises, reducing the base-emitter turn-on voltage and so enabling the current to rise even further. This type of positive feedback process can lead to damage in the device unless the current is limited in some manner.

For example, in a multi-finger device, this thermal effect can cause one finger in the device to have a lower turn-on voltage than the others so that substantially all of the collector current flows through the one finger. The gain of the device may be severely affected, and irreversible damage can arise if the condition is allowed to persist. The problem occurs even at constant base current operation.

A related problem is that hot spots can arise even within one finger, which can similarly cause collapse in the gain and/or burnout. This effect generally occurs only at constant base voltage operation. However, it is increasingly a problem in modern devices with low parasitic base and emitter resistances, where ballasting effects, that is where series resistance damps out instability (see, for example, Liou et al., IEEE Int. Microwave Symp. Dig., 281 (1993)), are absent or greatly reduced.

The foregoing considerations are particularly relevant for example to mobile communications devices such as telephones, where high power, high frequency signal amplification is required for radio frequency signal transmission.

Various means of mitigating this problem have been proposed, for example by ensuring that the heat in the device is spread uniformly over the device (see, for example, Bayraktaroglu et al., IEEE Electron Device Letters, 14, 493 (1993)), which however has only a limited effect. A proposal intentionally to incorporate base or collector ballast resistors has the undesirable effect of reducing the gain. The present invention seeks to overcome such limitations.

The present invention provides a bipolar transistor with a vertical geometry having a base region provided with a base contact, emitter and collector regions arranged to extract minority carriers from the base region, and a structure for counteracting entry of minority carriers into the base region via the base contact, wherein the base region has a bandgap of greater than 0.5 eV and a doping level greater than $10^{17}$ cm$^{-3}$.

In a transistor with a vertical geometry the separation between the emitter and collector is defined by the growth of the material, and so can be determined to monolayer thickness using molecular beam epitaxy. The transistor of the embodiment has emitter and collector regions on opposed sides of a base layer, and the thinness of the base layer, inter alia, enables high frequency operation, but at the risk of thermal runaway. By contrast, the emitter-collector separation in transistors with a horizontal (or lateral) geometry is determined by lithography. The consequential much greater characteristic length provides much less interaction between emitter and collector and hence a reduced gain, and reduced speed. Characteristically the emitter and collector regions are spaced laterally on the same side of the base region, as in Fujitsu discussed below.

An example of a transistor with horizontal geometry is disclosed in JP 050114602 (Fujitsu). Here a heterostructure base is provided to improve current gain, although it is believed that in practice it will have very little effect. Because it will be a low gain device, the problem of thermal runaway would not be expected to arise and it is not addressed in this patent. The only identifiable material is silicon, with an SiC or "compound semiconductor" wide gap layer.

For brevity in the description, the structure for counteracting entry of minority carriers into the base via the base contact will henceforth alternatively be termed an excluding structure. An excluding structure acts to accept majority carriers but does not supply minority carriers.

In a transistor according to the invention the excluding structure may be an excluding heterostructure or heterojunction, with a barrier to prevent carriers entering the base region. A heterostructure comprises materials with different band gaps on either side of the junction, for example in the present case a p$^+$p$^+$ junction, where the underscore indicates a wider band gap than that of the corresponding p layer.

Alternatively, the excluding structure may be an implanted region within the base region, providing a "high-low" differentially doped homojunction (semiconductor material with the same bandgap either side of the junction where a dopant concentration alters from one side of the junction to the other) which inhibits minority carrier entry into the base region. Such a structure may be for example a p$^{++}$p$^+$ junction (the $^+$ or $^{++}$ refer to overdoping and increased overdoping compared to the same layer type, and conversely $^-$ and $^{--}$ refer to underdoping) which comprise adjacent layers of the same semiconductor material but with different doping or carrier levels. Theoretically at least it would be possible to use different materials with the same bandgap either side of the junction, and with different carrier levels, so that this construction is more generally described as a 'high-low' doping junction. However, there are usually difficulties in matching the lattice constants of different materials.

The homojunction alternative not only permits simpler fabrication, but also allows the use of a wide gap passivation layer between the base and emitter regions, if desired. Such a passivation layer can improve performance by reducing recombination in the base region, which otherwise causes increased leakage and reduced current gain.

The transistor may be a high power III-V heterostructure bipolar transistor, preferably a high frequency transistor, for example of indium phosphide and gallium indium arsenide. One particularly suitable form is a transistor laid out in a multi-finger array, i.e. the body of the device is cut into fingers to facilitate heat removal from every part, and the base and emitter contacts are interdigitated so that current may be input and output more easily.

Particularly where the transistor is based on III-V materials, but not limited to transistors of that type, the emitter may be a heterostructure. No such emitter is disclosed in Fujitsu mentioned above.

In devices according to the invention thermal runaway is reduced, and they may therefore be operated at higher temperature or higher current. The stability of multi-finger devices may be increased without, for example, resorting to ballast resistors.

Our copending GB Application No 0012925.4 describes and claims a bipolar transistor having emitter and collector regions arranged to extract minority carriers from the base region, a structure for counteracting entry of minority carriers into the base region via the base contact (an excluding structure), the base region having a band gap of less than 0.5 eV and a doping level greater than $10^{17}$ cm$^{-3}$. Thus the use of a construction of this type is already known, but in respect of low band gap materials only. However, this arrangement has now surprisingly been found to have the unexpected benefit of reducing thermal runaway in wider band-gap material bipolar transistors, where intrinsic conduction is not important under normal conditions.

Semiconductor materials suitable for use in the invention have a band gap of greater than 0.5 eV, possibly greater than 0.52 eV, or even 0.55 eV or more. While any suitable such material known in the art may be employed, some preferred semi-conductor materials are GaAs, indium gallium arsenide (InGaAs), InGaAsSb, GaN, indium phosphide (InP), InGaP, AlGaN, AlGaAs, and InAlAs. In particular GaAs, InGaAs, InGaAsSb and GaN are useful materials for the base region, and in an excluding heterostructure InP, InGaP, AlGaN, AlGaAs and InAlAs are useful wide gap materials.

Transistors according to the invention preferably comprise more than one semiconductor composition with different bandgaps, so providing a heterostructure or heterojunction device. The heterostructure may occur in the base or collector region, for example.

Adjacent regions with different bandgaps may also have different dopant levels, for example a heterojunction $p^{++}p^{+}$.

In a preferred from of transistor according to the invention, the collector region includes a heterostructure. This construction has been found to decrease thermal runaway to an unexpected extent.

Transistors according to the invention may be fabricated using methods known to the person skilled in the art. Preferably, an excluding structure is formed by using regrowth to grow a $p^{+}p^{+}$ heterostructure, or by implanting p type dopants to produce a $p^{++}p^{+}$ homostructure.

Transistors according to the invention may alternatively be fabricated by leaving the wide bandgap emitter material in place over the extrinsic base after the emitter mesa is etched instead of etching down to the top of the base. The wide bandgap material would then just be etched away under the base contact (to improve contact resistance), and/or the base contact implant used to type convert it to p-type. The wide bandgap region then provides a passivation layer on top of the extrinsic base, which reduces recombination currents in the base, improving current gain.

While examples of junctions provided in this application relate to NPN bipolar transistors, it should be understood that similar considerations apply for PNP bipolar transistors.

The invention extends to a method of reducing the tendency to thermal runaway in a bipolar transistor with a vertical geometry having a base region provided with a base contact, emitter and collector regions arranged to extract minority carriers from the base region, the base region having a bandgap of greater than 0.5 eV and a doping level greater than $10^{17}$ cm$^{-3}$, by providing a structure for counteracting entry of minority carriers into the base region via the base contact.

Further features and advantages of the invention will become clear upon consideration of the appended claims, to which the reader is referred, and upon a reading of the following more detailed description of exemplary embodiments of the invention, made with reference to the accompanying drawings, in which:

Figure 1:
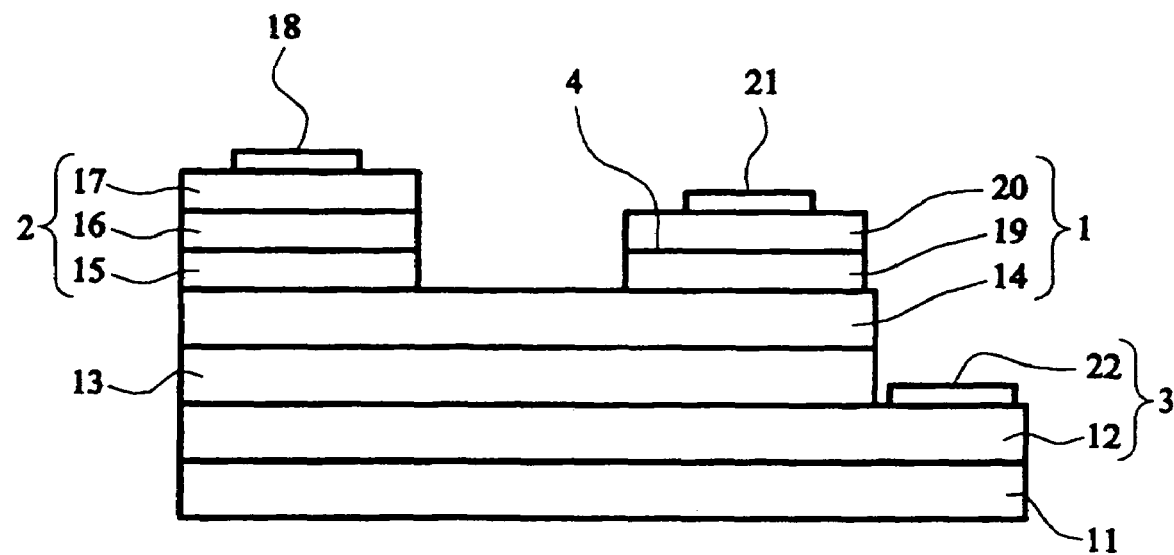
FIG. 1 is a schematic cross-sectional view of a transistor of the invention with an excluding heterostructure.

FIG. 1 shows a schematic cross-sectional view of an NPN bipolar transistor comprising a base 1, an emitter 2 and a relatively large collector 3. The excluding structure comprises a $p^{+}p^{+}$ junction heterojunction 4. The figures in brackets used in relation to this Figure and in FIG. 2 refer to carrier concentrations.

A 0.3 μm thick sub-collector layer 12 of n InGaAs ($6 \times 10^{18}$) and a 0.6 μm collector layer 13 of n InGaAs ($1 \times 10^{16}$) successively overlie a substrate layer 11 of semi-insulating InP. A 70 nm thick base layer 14 of p InGaAs ($1 \times 10^{19}$) lies over layer 13 and different areas thereof are in turn overlaid by a 100 nm thick emitter layer 15 of n InP ($4 \times 10^{17}$) and a 100 nm thick excluding base contact layer 19 of p InP ($2 \times 10^{19}$). Layer 15 is overlaid in turn by a 100 nm thick emitter cap layer 16 of n InP ($2 \times 10^{18}$), a 150 nm thick emitter contact layer 17 of n InGaAs ($1 \times 10^{19}$) and a emitter metal contact layer 18. Layer 19 is overlaid in turn by a 100 nm thick base cap/contact layer 20 of p InGaAs ($2 \times 10^{19}$), and a base metal contact layer 21.

A metal contact layer 22 is provided on sub-collector layer 12.

A comparative device used in the comparisons below is constructed as in FIG. 1 above but with the base cap/contact layer 20 and the base contact layer 19 omitted.

Figure 2:
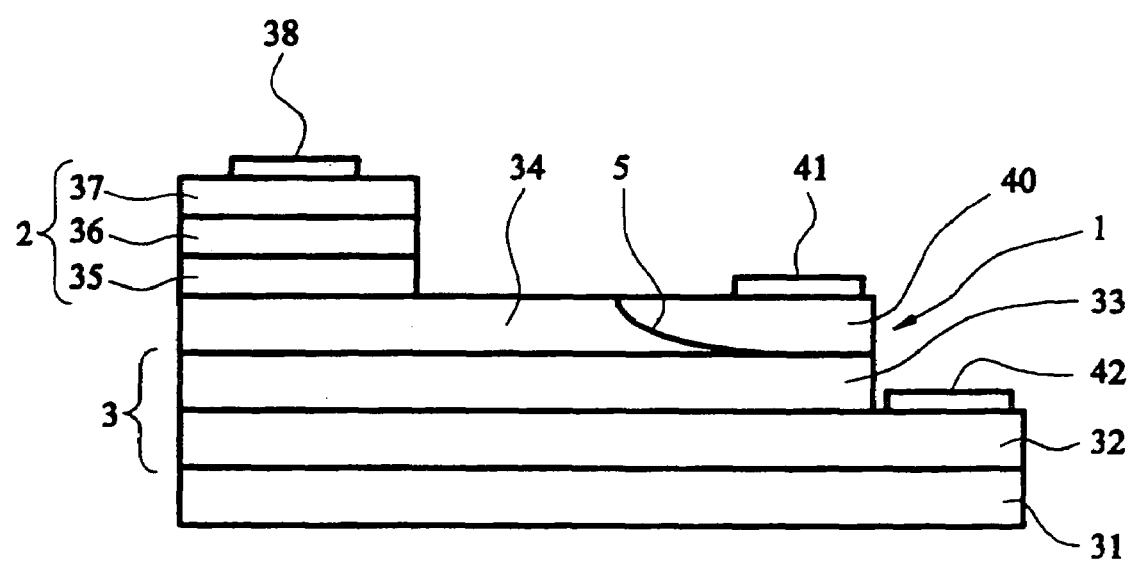
FIG. 2 is a schematic cross-sectional view of a transistor of the invention with an excluding homostructure.

FIG. 2 shows a schematic cross-sectional view of an NPN bipolar transistor comprising a base 1, an emitter 2 and a relatively large collector 3. The excluding structure comprises a $p^{+}p^{+}$ homojunction 5.

A 0.3 μm thick sub-collector layer 32 of n InGaAs ($6 \times 10^{18}$) and a 0.6 μm collector layer 33 of n InGaAs ($1 \times 10^{16}$) successively overlie a substrate layer 31 of semi-insulating InP. A 70 nm thick base layer 34 of p InGaAs ($1 \times 10^{19}$) lies over layer 33 but includes a local 100 nm thick region of p InP ($2 \times 10^{19}$) providing a base excluding contact 40 which carries a metal base cap layer 41. Layer 34 is in turn overlaid by a 100 nm thick emitter layer 35 of n InP ($4 \times 10^{17}$), a 100 nm thick emitter cap layer 36 of n InP ($2 \times 10^{18}$), a 150 nm thick emitter contact layer 37 of n InGaAs ($1 \times 10^{19}$) and a metal emitter contact layer 38.

A metal contact layer 42 is provided on sub-collector layer 12.

Figure 3:
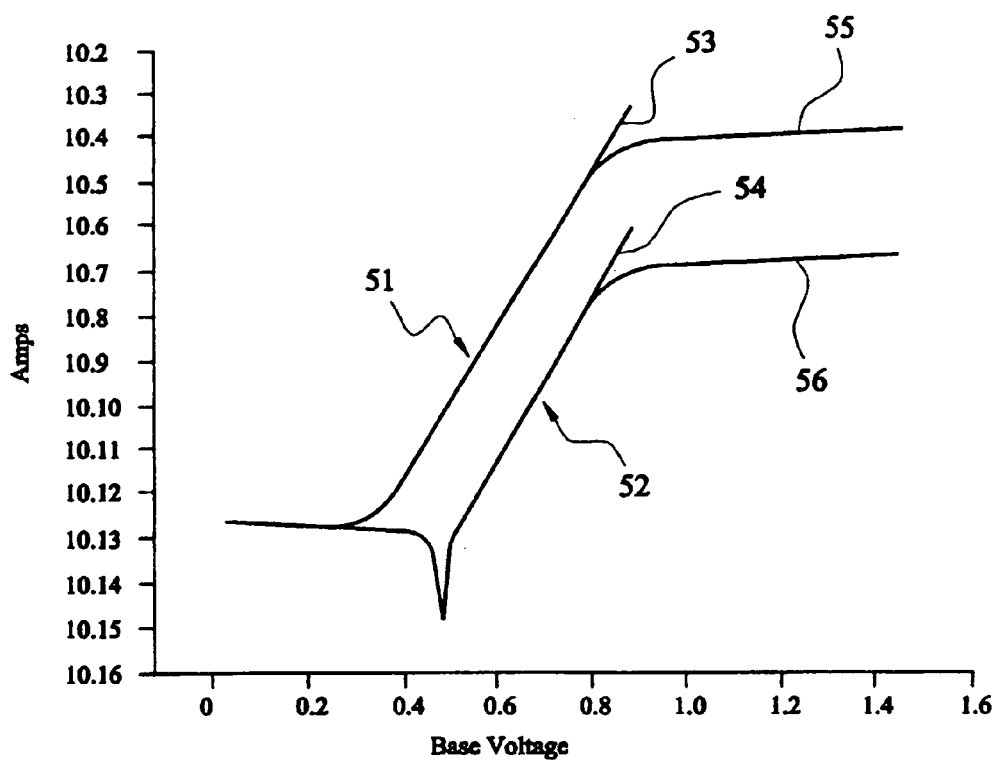
FIG. 3 is a graph showing a Gummel plot for the transistor of FIG. 1 and for an equivalent device without the excluding heterostructure.

FIG. 3 illustrates thermal runaway characteristics of the device of FIG. 1 and the comparative device mentioned above, as obtained by 2D thermal/drift-diffusion modelling. It is a Gummel plot of collector and base currents (in amps per micron—2d simulation) versus base voltage at $V_{ce}$=0.8 V. The upper part 51 of the plot shows the collector current and the lower part 52 the base current, and it will be seen that the device of the invention, with the excluding structure, permits larger values of current before the onset of thermal runaway. The device without the excluding contact shows marked thermal runaway as shown by the continued rise in the both base and collector currents at $V_{be}$~0.9 V (when the devices are modelled, the current-voltage curves actually have an infinitely steep slope at this point, and it should be noted that the vertical axis is in any case exponential). In contrast, the device of the invention remains stable out to at least 1.5 V as indicated by the portions 55, 56.

The addition of the base contact greatly reduces the temperature coefficient of the base-emitter junction, allowing stable operation over the whole range of base-emitter voltages. The decreased base current necessary for a given collector current also means that the current gain is increased by about 10% in normal operation.

Figure 4:
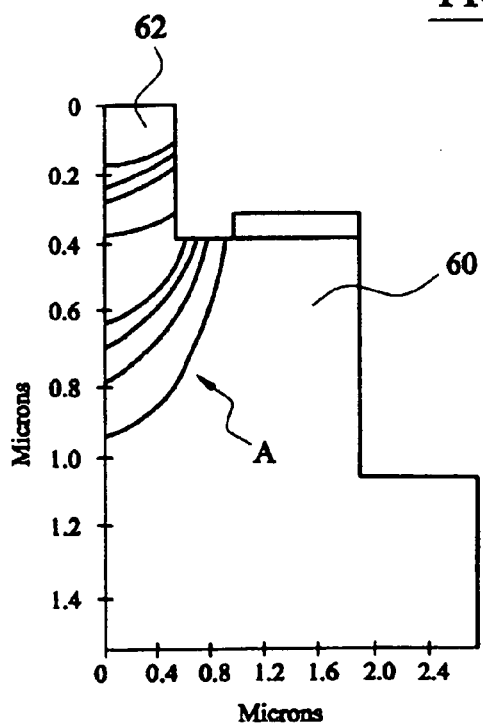
FIG. 4 shows the thermal characteristics of the transistor of FIG. 1.
Figure 5:
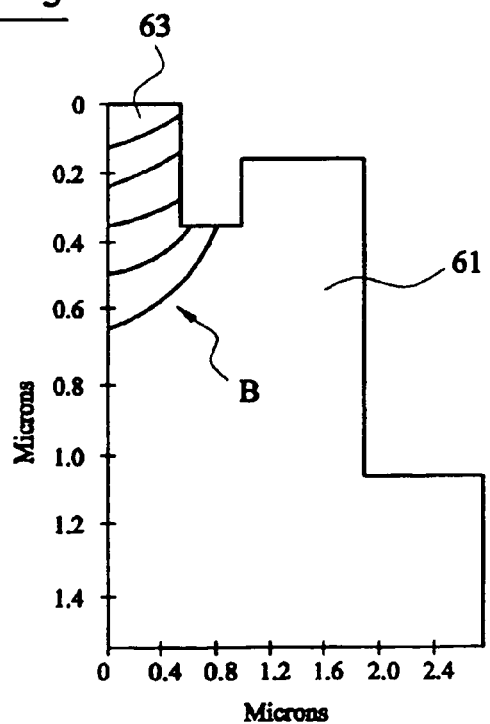
FIG. 5 shows the thermal characteristics of the device of the equivalent device to that of FIG. 1 without the excluding heterostructure.

FIGS. 4 and 5 are contour plots respectively showing the temperature characteristics of the FIG. 1 transistor and the comparative device at a base-emitter voltage $V_{be}$ of 0.9V. The temperature of the counters increases in the direction of the arrows A and B respectively. In FIG. 4 the lowest temperature region 60 shown is at about 330° C. and the highest temperature region 62 shown is at about 375° C. In FIG. 5 the lowest temperature region 61 shown is at about 325° C. and the highest temperature region 62 shown is at about 335° C. Thus lower temperature operation of the transistor of FIG. 5 according to the invention is clearly illustrated. It is clear that the comparative device reaches very high temperatures, increasing the chance of device failure and greatly reducing device lifetime.

What is claimed is:

1. A bipolar transistor with a vertical geometry having a base region having two sides and provided with a base contact, emitter and collector regions arranged to extract minority carriers from the base region, and a structure for counteracting entry of minority carriers into the base region via the base contact, wherein the base contact and emitter region are upstanding from the same side of the base region and the base region has a bandgap greater than 0.5 eV and a doping level greater than $10^{17}$ cm$^{-3}$.

2. A transistor according to claim 1 wherein the structure for counteracting entry of minority carriers comprises a heterostructure.

3. A transistor according to claim 1 based on III-V materials.

4. A transistor according to claim 1 wherein the base region comprises one of GaAs, InGaAs, InGaAsSb and GaN.

5. A transistor according to claim 1 wherein the structure for counteracting entry comprises one of InP, InGaP, AlGaN, AlGaAs and InAlAs.

6. A transistor according to claim 1 wherein the transistor is a heterostructure.

7. A transistor according to claim 1 wherein the transistor is a high frequency transistor.

8. A transistor according to claim 1 wherein the transistor is of multi-finger array construction.

9. A transistor according to claim 1 wherein the bandgap is greater than 0.52 eV.

10. A method of reducing a tendency to thermal runaway in a vertical geometry bipolar transistor having a base region provided with a base contact and emitter and collector regions arranged to extract minority carriers from the base region, the base contact and the emitter region being upstanding from the same side of the base region and the base region having a bandgap of greater than 0.5 eV and a doping level greater than $10^{17}$ cm$^{-3}$, and the method incorporating providing a structure for counteracting entry of minority carriers into the base region via the base contact.

11. A bipolar transistor with a vertical geometry having a base region provided with a base contact, emitter and collector regions arranged to extract minority carriers from the base region, and a homostructure with differential doping for counteracting entry of minority carriers into the base region via the base contact, wherein the base region has a band gap greater than 0.5 eV and a doping level greater than $10^{17}$ cm$^{-3}$.

12. A transistor according to claim 11 wherein the heterostructure collector region comprises a wide gap material which is one of InP, InGaP, AlGaN, AlGaAs and InAlAs.

13. A bipolar transistor with a vertical geometry having a base region provided with a base contact, emitter and collector regions arranged to extract minority carriers from the base region, and a structure for counteracting entry of minority carriers into the base region via the base contact, wherein the emitter region is a heterostructure and the base region has a band gap greater than 0.5 eV and a doping level greater than $10^{17}$ cm$^{-3}$.

14. A transistor according to claim 13 wherein the heterostructure emitter region comprises a wide gap material selected from InP, InGaP, AlGaN, AlGaAs and InAlAs.

15. A bipolar transistor with a vertical geometry having a base region provided with a base contact, emitter and collector regions arranged to extract minority carriers from the base region, and a structure for counteracting entry of minority carriers into the base region via the base contact, wherein the collector region is a heterostructure and the base region has a band gap greater than 0.5 eV and a doping level greater than $10^{17}$ cm$^{-3}$.

16. A bipolar transistor with a vertical geometry having a base region provided with a base contact, emitter and collector regions arranged to extract minority carriers from the base region, and a structure for counteracting entry of minority carriers into the base region via the base contact, wherein the collector region is a heterostructure incorporating a wide gap material which is one of InP, InGaP, AlGaN, AlGaAs and InAlAs and the base region has a band gap greater than 0.5 eV and a doping level greater than $10^{17}$ cm$^{-3}$.

17. A bipolar transistor with a vertical geometry having a base region provided with a base contact, emitter and collector regions arranged to extract minority carriers from the base region, and a structure for counteracting entry of minority carriers into the base region via the base contact, wherein the emitter region is a heterostructure incorporating a wide gap material which is one of InP, InGaP, AlGaN, AlGaAs and InAlAs and the base region has a band gap greater than 0.5 eV and a doping level greater than $10^{17}$ cm$^{-3}$.

* * * * *